United States Patent
Zhao et al.

(10) Patent No.: US 11,362,584 B2
(45) Date of Patent: Jun. 14, 2022

(54) ADAPTIVE RAMP SIGNAL GENERATION

(71) Applicant: TEXAS INSTRUMENTS INCORPORATED, Dallas, TX (US)

(72) Inventors: Wei Zhao, Shanghai (CN); Jianzhang Xie, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 171 days.

(21) Appl. No.: 16/711,200

(22) Filed: Dec. 11, 2019

(65) Prior Publication Data
US 2020/0266702 A1 Aug. 20, 2020

Related U.S. Application Data

(60) Provisional application No. 62/807,128, filed on Feb. 18, 2019.

(51) Int. Cl.
| | |
|---|---|
| *H02M 3/00* | (2006.01) |
| *H02M 3/07* | (2006.01) |
| *H03K 4/06* | (2006.01) |
| *H02M 1/00* | (2006.01) |
| *H03K 4/50* | (2006.01) |

(52) U.S. Cl.
CPC ........... *H02M 3/07* (2013.01); *H02M 1/0003* (2021.05); *H02M 1/0012* (2021.05); *H03K 4/06* (2013.01); *H03K 4/50* (2013.01)

(58) Field of Classification Search
CPC .................. H02M 3/07; H02M 3/1582; H02M 2001/0025; H03K 4/06; H03K 3/03
See application file for complete search history.

(56) References Cited

U.S. PATENT DOCUMENTS

| | | | |
|---|---|---|---|
| 9,882,489 B2 | 1/2018 | Li | |
| 2011/0199062 A1* | 8/2011 | Singnurkar | H02M 3/1582 323/282 |
| 2016/0105110 A1 | 4/2016 | Houston | |
| 2018/0287497 A1* | 10/2018 | Mehas | G05F 1/10 |

OTHER PUBLICATIONS

PCT Search Report dated Jun. 4, 2020.

* cited by examiner

*Primary Examiner* — Adolf D Berhane
*Assistant Examiner* — Afework S Demisse
(74) *Attorney, Agent, or Firm* — Valerie M. Davis; Charles A. Brill; Frank D. Cimino

(57) ABSTRACT

Aspects of the disclosure provide for a circuit. In some examples, the circuit includes a first charging path including a first capacitor coupled to a first output node. The circuit further includes a second charging path comprising a first switch and a second capacitor. The circuit further includes a third charging path comprising a second switch and a third capacitor. The circuit further includes a first discharging path comprising the second capacitor, a third switch coupled between the second charging path and a second output node, and a fourth switch coupled between the second charging path and a fourth node. The circuit further includes a second discharging path comprising the third capacitor, a fifth switch coupled between the third charging path and the second output node, and a sixth switch coupled between the third node and the fourth node.

34 Claims, 8 Drawing Sheets

ADAPTIVE RAMP SIGNAL GENERATION

CROSS-REFERENCE TO RELATED APPLICATIONS

The present application claims priority to U.S. Provisional Patent Application No. 62/807,128, which was filed Feb. 18, 2019, is titled "ADAPTIVE RAMP CIRCUIT FOR BUCK-BOOST CONVERTER WITH WIDE RANGE OF VIN, VOUT AND SWITCHING FREQUENCY," and is hereby incorporated herein by reference in its entirety.

BACKGROUND

A switched mode power supply (SMPS) transfers power from an input power source to a load by switching one or more power transistors coupled through a switch node/terminal to an energy storage element (such as an inductor/transformer and/or capacitor), which is capable of coupling to the load. The power transistors can be included in a power converter that includes, or is capable of coupling to, the energy storage element. An SMPS can include an SMPS controller to provide one or more gate control signals to the power transistor(s). Generation of the gate control signal may be at least partially controlled by one or more ramp signals.

SUMMARY

At least some aspects of the present disclosure provide for a circuit. In at least some examples, the circuit includes a first charging path including a first capacitor coupled to a first output node. The circuit further includes a second charging path comprising a first switch and a second capacitor. The circuit further includes a third charging path comprising a second switch and a third capacitor. The circuit further includes a first discharging path comprising the second capacitor, a third switch coupled between the second charging path and a second output node, and a fourth switch coupled between the second charging path and a fourth node. The circuit further includes a second discharging path comprising the third capacitor, a fifth switch coupled between the third charging path and the second output node, and a sixth switch coupled between the third node and the fourth node.

Other aspects of the present disclosure provide for a circuit. In at least some examples, the circuit includes a current signal generation circuit configured to generate a current signal based on an input voltage value, an output voltage value, and a frequency of operation. The circuit further includes a ramp signal generation circuit coupled to the current signal generation circuit and configured to generate a first ramp signal by charging a first capacitor based on the current signal, wherein a voltage of the first capacitor while charging is the first ramp signal. The ramp signal generation circuit is further configured to generate a second ramp signal by charging a second capacitor and a third capacitor based on a scaled version of the current signal. A voltage of the second capacitor while discharging is the second ramp signal during a first period. A voltage of the third capacitor while discharging is the second ramp signal during a second period. In this way, the second ramp signal may be referred to as a continuous ramp signal because it transitions from one falling signal (e.g., of the second capacitor) to another falling signal (e.g., of the third capacitor) with the transition having substantially no delay (e.g., no delay for recharging the second or third capacitor).

Other aspects of the present disclosure provide for a system. In at least some examples, the system includes a power converter and a controller coupled to the power converter. The controller includes a current signal generation circuit configured to generate a current signal based on an input voltage value of the power converter, an output voltage value of the power converter, and a switching frequency of the power converter. The controller further includes a ramp signal generation circuit configured to generate a first ramp signal by charging a first capacitor based on the current signal, wherein a voltage of the first capacitor while charging is the first ramp signal. The ramp signal generation circuit is further configured to generate a second ramp signal by charging a second capacitor and a third capacitor based on a scaled version of the current signal. A voltage of the second capacitor while discharging is the second ramp signal during a first period. A voltage of the third capacitor while discharging is the second ramp signal during a second period. The controller further includes a comparator configured to compare the first ramp signal or the second ramp signal to an error signal determined at least partially according to an output current of the power converter. The comparator is further configured to generate a pulse-width modulation signal, based on the comparison, to specify a duty cycle for the power converter.

BRIEF DESCRIPTION OF THE DRAWINGS

For a detailed description of various examples, reference will now be made to the accompanying drawings in which.

DETAILED DESCRIPTION

Figure 1:
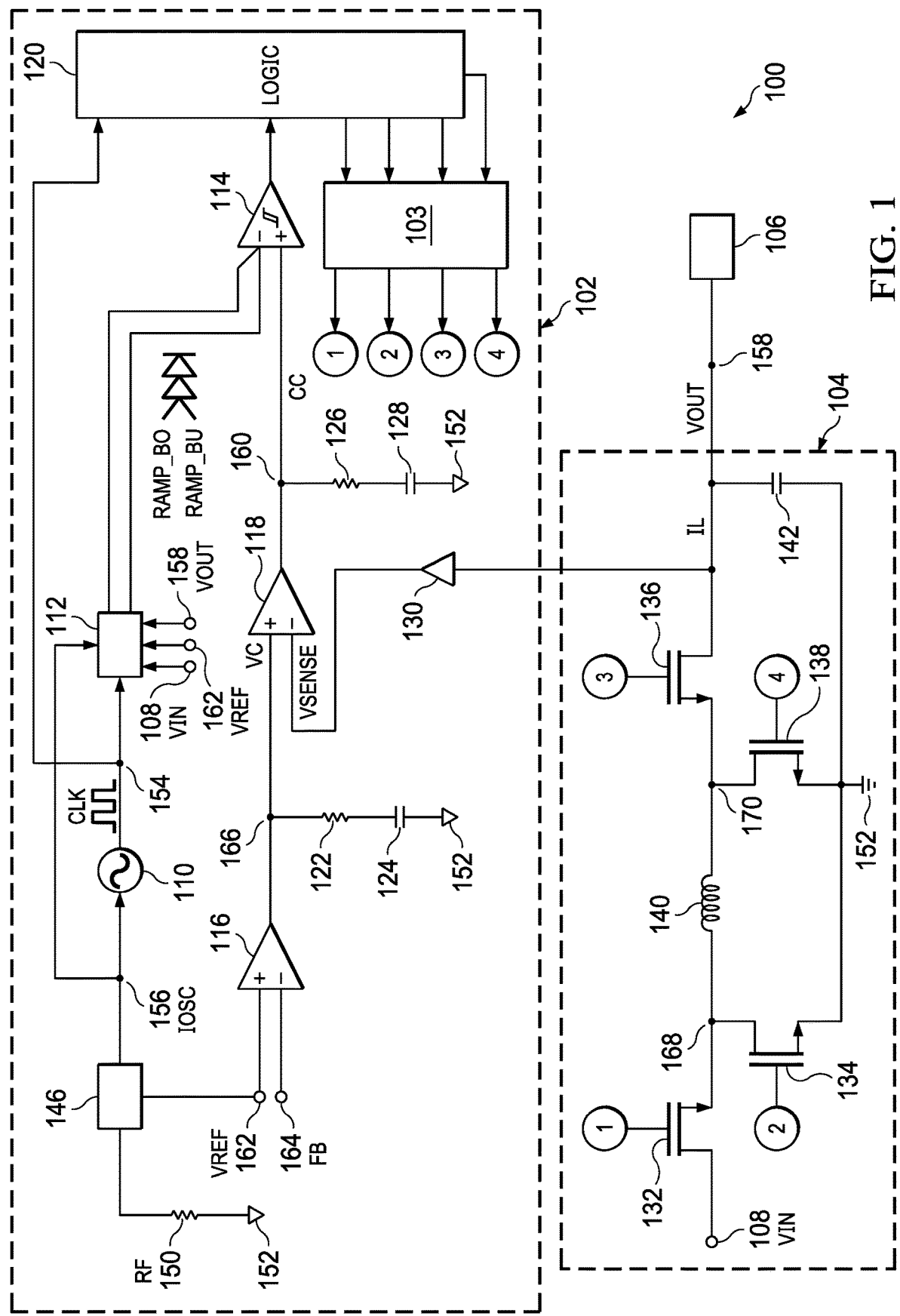
FIG. 1 shows a block diagram of an illustrative power delivery system in accordance with various examples.

At least some power converters utilize ramp signals in controlling a duty cycle of switches of the power converters. For example, an error amplifier may output an error signal that is compared to a ramp signal. The error signal may indicate, be proportional to, or have another relationship to a deviation in an actual output of the power converter from a desired value for the output of the power converter. Based on a relationship between the error signal and the ramp signal, the power converter may be controlled to operate in a certain manner. For example, in a buck power converter, the ramp signal may have a positive slope. When a value of the ramp signal reaches a value of the error signal, a high-side transistor of the power converter is controlled to turn on or conductive. When the high-side transistor is turned on, the buck power converter is said to be in a buck energize phase. Similarly, in a boost power converter, the ramp signal may have a negative slope. When a value of the ramp signal reaches a value of the error signal, a high-side transistor of the power converter is controlled to turn on. When the high-side transistor is turned on, the high-side transistor is conducive and the boost power converter is said to be in a boost de-energize phase. An amount or percentage of time of a given switching cycle of the power converter that the high-side transistor is turned on is the duty cycle of the high-side transistor. Further, the duty cycle of the high-side transistor, in at least some examples, has a proportional relationship to the output of the power converter. For example, increasing the duty cycle of the high-side transistor increases the value of the output of the power converter and decreasing the duty cycle of the high-side transistor decreases the value of the output of the power converter.

In some power converters, such as buck-boost power converters, this functionality is combined. For example, a buck ramp signal and a boost ramp signal are both generated and compared to the error signal to determine a duty cycle of the high-side transistor. To provide optimized operation of the power converter, amplitudes of the buck and boost ramps may be controlled. In at least some examples, optimized operation of the power converter means the power converter has stable switching behavior and a fastest possible response time to transient signal changes. For example, for a power converter configured to operate for a specific input voltage (VIN), output voltage (VOUT), or switching frequency (SW_FREQ), the buck and boost ramps may have a certain fixed slope value (e.g., a preconfigured value), a certain amplitude, etc. However, that same slope value, amplitude, or other characteristic of the buck and boost ramps may not provide optimal performance of the power converter for another combination of VIN, VOUT, and SW_FREQ values. Accordingly, the power converter may have limited efficiency in circumstances outside of a specific range of VIN, VOUT, and SW_FREQ. For example, an amount of time required for the buck or boost ramp to reach the error signal in value may be longer than optimal, causing greater value voltage overshoot and/or undershoot and therefore larger amplitude ripple. Therefore, for some power converters that are designed with wide operational ranges, a buck ramp and a boost ramp that have a fixed slope or amplitude may be unable to provide optimal performance across the full wide operational range. For example, in a power converter suitable for a VIN range of about 2.7 volts (V) to 36V, a VOUT range of about 0.8V to 21.26V, and a SW_FREQ range of about 200 kilohertz to about 2.2 megahertz, a buck ramp and a boost ramp that have a fixed slope or amplitude may not provide optimal performance across the full wide operational range.

At least some aspects of the present disclosure provide for a ramp signal generation circuit. In some examples, the ramp signal generation circuit generates a single ramp signal (e.g., a buck ramp signal or a boost ramp signal). In other examples, the ramp signal generation circuit generates a plurality of ramp signals (e.g., one or more buck ramp signals and one or more boost ramp signals). The ramp signals, in at least some examples, are generated dynamically at least partially according to VIN, VOUT, and SW_FREQ. In this way, as VIN, VOUT, and/or SW_FREQ vary, the ramp signals may compensate for that variation. For example, a ramp current (IRAMP) is generated based on a minimum of VIN or VOUT and a signal that includes information indicative of SW_FREQ. Subsequently, IRAMP is switched by one or more switches controlled according to a plurality of clock signals to charge a plurality of capacitors. Signals present at nodes coupled, in some examples by switches, to a top plate of a capacitor are the ramp signals. In this way, the ramp signals vary with changes in VIN, VOUT, and/or SW_FREQ to provide ramp slopes and/or amplitudes optimized for a particular combination of VIN, VOUT, and SW_FREQ.

Turning now to FIG. 1, a block diagram of an illustrative power delivery system 100 is shown. In at least some examples, the system 100 is representative of a consumer electronic device, such as a laptop computer, tablet device, smartphone, wearable device, etc. In other examples, the system 100 is representative of an enterprise electronic device, such as a server, a network appliance, etc. In yet other examples, the system 100 is representative of an automobile. Generally, the system 100 is representative of any system that includes a switched mode power supply that receives VIN and generates VOUT to provide to a load.

In at least one example, the system 100 includes a controller 102, a power converter 104, and a load 106. The power converter 104 is configured to regulate delivery of power from a power source 108 that provides VIN to the load 106 as VOUT. In some examples, the power source 108 is a battery, while in other examples the power source 108 is a form of mains power that itself may be an output of a converter or regulator. Additionally, in some examples the load 106 is a rechargeable battery, while in other examples the load 106 is one or more components, circuits, subsystems, etc. which may or may not also include a rechargeable battery.

The controller 102, in at least some examples, includes an oscillator 110, a ramp signal generation circuit 112, a comparator 114, an error amplifier 116, an error amplifier 118, and a logic circuit 120. In some examples, the comparator 114 includes three input terminals and an output terminal such that the comparator 114 compares a signal at the first input terminal to a signal at the third input terminal or a signal at the second input terminal to the signal at the third input terminal. In some examples, the comparator 114 includes a multiplexer for selecting between the first input terminal or the second input terminal for comparison to the third input terminal. In other examples, the comparator 114 is representative of two separate comparators. In such an example, a first of the comparators receives RAMP_BU at a negative or inverting input terminal and receives CC at a positive or non-inverting input terminal. A second of the comparators receives RAMP_BO at a negative or inverting input terminal and receives CC at a positive or non-inverting input terminal. Each of the comparators may provide an output signal to the logic circuit 120, or the output signals of the comparators may be processed (e.g., such as via a logical OR circuit) prior to receipt by the logic circuit 120. For the sake of clarity of illustration, because both RAMP_BO and RAMP_BU are compared to CC, the comparator 114 is illustrated as receiving both RAMP_BO and RAMP_BU at the same terminal, but in practice may be modified according to the above discussion.

In some examples, the controller 102 further includes a resistor 122, a capacitor 124, a resistor 126, a capacitor 128, and a current sense circuit 130. In at least some examples, the controller 102 further includes a frequency circuit 146. At least one example of the system 100 includes at least some aspects of the controller 102 and the power converter 104 on a same semiconductor die and/or in a same component package, while in other examples the controller 102 and the power converter 104 may be fabricated separately and configured to couple together. Additionally, at least some aspects of the controller 102 may be fabricated separately and coupled together. In some examples, the system 100 also includes a driver 103. In some implementations, the driver 103 may be a component of the controller 102, while in other implementations the controller 102 does not include the driver 103 and instead is configured to couple to the driver 103. The power converter 104, in some examples, includes a transistor 132, a transistor 134, a transistor 136, a transistor 138, and an inductor 140. In at least some examples, the power converter 104 further includes a capacitor 142. In various examples, the logic circuit 120 implements a state machine or other control method or algorithm to control generation of control signals for controlling the driver 103 to generate gate control signals for controlling the transistor 132, the transistor 134, the transistor 136, and/or the transistor 138. In at least one implementation, the state machine implemented by the logic circuit 120 is substantially similar to the state machine discussed below with respect to FIG. 9. The logic circuit 120 performs the control at least partially based on CLK, an output of the comparator 114, and a control scheme for operating the power converter 104 in a desired mode of operation. A particular architecture of the logic circuit 120 is not limited herein.

In at least one example architecture, the frequency circuit 146 has an input terminal configured to couple to a ground node 152 through a resistor 150, and an output terminal coupled to the node 156. The oscillator 110 has an input terminal coupled to the node 156 and an output terminal coupled to the node 154. The ramp signal generation circuit 112 has a first input terminal coupled to the node 154, a second input terminal coupled to the power source 108, and a third input terminal coupled to a node 158. The ramp signal generation circuit further has a first output terminal and a second output terminal each coupled to a first input terminal (e.g., a negative or inverting input terminal) of the comparator 114. The comparator 114 further has a second input terminal (e.g., a positive or non-inverting input terminal) coupled to a node 160 and an output terminal coupled to an input terminal of the logic circuit 120.

The error amplifier 116 has a first input terminal (e.g., a positive or non-inverting input) coupled to a node 162, a second input terminal (e.g., a negative or inverting input terminal) coupled to a node 164, and an output terminal coupled to a node 166. In at least some examples, the node 162 is configured to receive a reference voltage (VREF) and the node 164 is configured to receive a feedback signal (FB). FB, in some examples, is output by a feedback circuit (not shown). In at least one example, the feedback circuit is a voltage divider (not shown) coupled between the node 158 and the ground node 152 and having an output at the node 164. In at least some examples, a top plate of the capacitor 124 is coupled to the node 166 through the resistor 122 and a bottom plate of the capacitor 124 is coupled to the ground node 152. The error amplifier 118 has a first input terminal (e.g., a positive or non-inverting input) coupled to the node 166, a second input terminal (e.g., a negative or inverting input terminal) coupled to an output terminal of the current sense circuit 130, and an output terminal coupled to the node 160. In at least some examples, a top plate of the capacitor 128 is coupled to the node 160 through the resistor 126 and a bottom plate of the capacitor 128 is coupled to the ground node 152. The logic circuit 120, in some examples, has another input terminal coupled to the node 154 and one or more output terminals. Each of the output terminals is configured to couple to the driver 103. In some examples, the driver 103 is a singular component. In other examples, the driver 103 is representative of a plurality of drivers, where each driver has an input terminal configured to couple to one respective output terminal of the logic circuit 120. In at least some examples in which the driver 103 is representative of a plurality of drivers, each of the individual drivers is an inverter (not shown). The driver 103 includes one or more output terminals, with each output terminal of the driver 103 configured to couple to a gate terminal of one respective transistor from among the transistor 132, the transistor 134, the transistor 136, and the transistor 138.

The transistor 132 has a drain terminal configured to couple to the power source 108, a source terminal coupled to a node 168, and a gate terminal coupled to an output terminal of the driver 103. The transistor 134 has a drain terminal coupled to the node 168, a source terminal coupled to the ground node 152, and a gate terminal coupled to another output terminal of the driver 103. The inductor 140 is coupled between the node 168 and a node 170. The transistor 136 has a drain terminal coupled to the node 158, a source terminal coupled to the node 170, and a gate terminal coupled to another output terminal of the driver 103. The transistor 138 has a drain terminal coupled to the node 170, a source terminal coupled to the ground node 152, and a gate terminal coupled to another output terminal of the driver 103. In at least some examples, the capacitor 142 is coupled between the node 158 and the ground node 152. Further, the current sense circuit 130 has an input terminal coupled to the node 158 and the load 106 is configured to couple to the power converter 104 at the node 158. The coupling of the current sense circuit 130 is merely an example of placement of the current sense circuit 130. Various other implementations of the system 100 may include the current sense circuit 130 coupled to any other suitable node or component of the power converter 104.

In at least one example of operation of the system 100, the controller 102 controls the power converter 104 to provide VOUT at node 158 to the load 106. For example, FB has a value proportional to VOUT and VREF indicates a desired value for FB. The error amplifier 116 outputs an error signal (VC) at the node 166 having a value based on the difference between VREF and VFB and which is filtered by the resistor 122 and the capacitor 124. The error amplifier 118 subsequently outputs a second error signal (CC) at the node 160 having a value based on a difference between the error signal and a current sense signal (VSENSE) and filtered by the resistor 126 and the capacitor 128. In at least some examples, VSENSE is a voltage signal output by the current sense circuit 130 and having a voltage proportional to an inductor current (IL) of the power converter 104.

The oscillator 110 receives IOSC at the node 156 and, based on IOSC, generates CLK. In at least some examples, the oscillator 110 further generates one or more additional signals based on, or derived from, CLK. While shown for the sake of simplicity as having only one coupling from the oscillator 110 to the ramp signal generation circuit 112, in at least some examples the system 100 includes a plurality of couplings between the oscillator 110 and the ramp signal generation circuit. The number of couplings may correspond to a number of different clock signals provided to the ramp signal generation circuit 112 by the oscillator 110. In other examples, the ramp signal generation circuit includes circuitry (not shown) configured to generate one or more additional clock signals derived from CLK as received from the oscillator 110. In at least some examples, IOSC is generated by the frequency circuit 146 based at least partially on a value of the resistor 150. The value of the resistance of the resistor 150 may be referred to herein as RF. For example, IOSC is generated by the frequency circuit 146 according to VREF/RF, where VREF has a same value as received at the node 162, as shown in FIG. 1. Although not shown, alternatively the VREF used in determining IOSC and provided to the ramp signal generation circuit 112 may not be the same value as received at the node 162 and instead may be any suitable value other than a value of VREF received at the node 162. Therefore, in at least some examples, IOSC changes in value with changes to the resistance of the resistor 150. In at least some examples, CLK is generated by charging a capacitor (not shown) with IOSC and comparing, via a comparator (not shown), a voltage at a top plate of the capacitor to a threshold value. When the voltage at the top plate of the capacitor exceeds the threshold, the comparator outputs CLK having an asserted, or logical high, value. When the voltage at the top plate of the capacitor does not exceed the threshold, the comparator outputs CLK having a de-asserted, or logical low, value. In this way, a frequency of CLK is at least partially controlled by a value of resistance of the resistor 150.

Based at least in part on CLK, VIN, and VOUT, the ramp signal generation circuit 112 generates a buck ramp signal (RAMP_BU) and a boost ramp signal (RAMP_BO). The ramp signal generation circuit 112 generates RAMP_BU and RAMP_BO, in at least some examples, by selecting one of VIN or VOUT having a minimum value and performing one or more multiplication or division operations to generate RAMP. The multiplications or divisions, in at least some examples, are performed by one or more transistors (not shown) sourced by a plurality of current sources (not shown) to generate IRAMP. Subsequently, the ramp signal generation circuit controls one or more switches to provide IRAMP, or a scaled version of RAMP, to a plurality of capacitors (not shown). This causes RAMP_BU to be present at a top plate of one of the capacitors and RAMP_BO to be present at a switched node between top plates of two of the capacitors. RAMP_BU and RAMP_BO are each output by the ramp signal generation circuit 112 to the comparator 114.

The comparator 114 compares RAMP_BU and RAMP_BO to CC. Based on the comparison, the comparator 114 outputs a comparison result to the logic circuit 120. In at least some examples, the comparison result is a pulse width modulation (PWM) signal, where a duty cycle of the PWM signal at least partially controls operation of the power converter 104. The logic circuit 120 receives CLK from the node 154 and the PWM signal output by the comparator 114. Based on CLK and the PWM signal output by the comparator 114, the logic circuit 120 generates a plurality of control signals, where each control signal corresponds uniquely to one of the transistor 132, the transistor 134, the transistor 136, or the transistor 138. For example, at a rising edge of CLK, in one implementation, the logic circuit 120 generates a plurality of control signals to operate the power converter 104 in a particular mode of operation and continues operating in that mode of operation until a minimum on time has expired, CLK is de-asserted, and the PWM signal is de-asserted.

Based on the control signals received from the logic circuit 120, the driver 103 generates gate control signals for controlling power transistors of the power converter 104, as discussed above. For example, the driver 103 generates gate control signals that alternatingly, and selectively, turn the transistor 132, the transistor 134, the transistor 136, and/or the transistor 138 on and off. This on and off sequence energizes and de-energizes elements of the power converter 104 such as the inductor 140 and/or the capacitor 142. The energizing and de-energizing provides the buck, boost, and/or buck-boost functionality of the power converter 104. The driver 103 is implemented according to any suitable architecture, the scope of which is not limited herein.

The power converter 104, when implemented as a buck boost power converter, can operate in a buck mode of operation or in a boost mode of operation. To control the mode of operation of the power converter 104, the controller 102 provides gate control signals to one or more of the transistor 132, the transistor 134, the transistor 136, and/or the transistor 138. A value of each of these gate control signals determines whether a respective one of the transistor 132, the transistor 134, the transistor 136, and/or the transistor 138 receiving the gate control signal is in a conductive state (e.g., turned on) or in a non-conductive state (e.g., turned off). To change a mode of operation of the power converter 104, the controller 102 modifies a value of one or more of the gate control signals to turn one or more of the transistor 132, the transistor 134, the transistor 136, and/or the transistor 138 on or off. Additionally, while remaining in a mode of operation of the power converter 104, the controller 102 may modify a value of one or more of the gate control signals, for example, to alternatively turn on and turn off one or more of the transistor 132, the transistor 134, the transistor 136, and/or the transistor 138.

In one example, the transistor 132, the transistor 134, the transistor 136, and/or the transistor 138 are controlled to turn on (e.g., conduct current between their respective drain terminals and source terminals) and/or turn off (e.g., cease conducting current between their respective drain terminals and source terminals) based on a signal received at their respective gate terminals. For example, based on a gate control signal received from the controller 102 (e.g., as output by the driver 103 under control of the logic circuit 120), one or more of the transistor 132, the transistor 134, the transistor 136, and/or the transistor 138 are controlled to turn on or turn off. The transistor 132, the transistor 134, the transistor 136, and/or the transistor 138 may turn on (or off) based on a value, or relationship between values, present at one or more of their respective gate terminals and/or source terminals.

Figure 2:
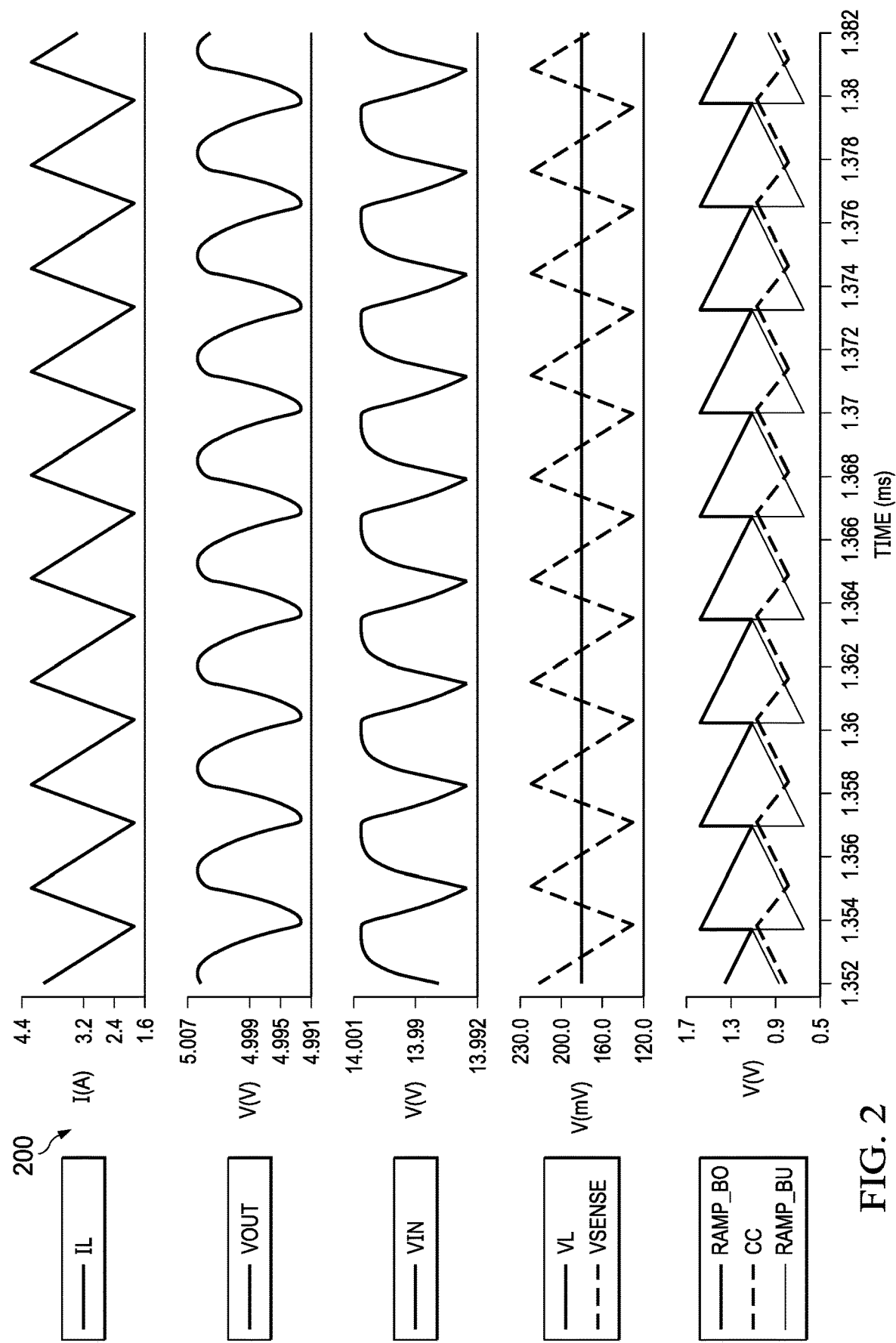
FIG. 2 shows a diagram of illustrative power converter signal waveforms in accordance with various examples.

Turning now to FIG. 2, a diagram 200 of illustrative power converter signal waveforms is shown. The diagram 200 illustrates signal waveforms present in at least some implementations of the system 100 of FIG. 1 when the power converter 104, also of FIG. 1, is operating in a buck mode of operation. Accordingly, reference is made to components of FIG. 1 in describing the diagram 200. Illustrated in the diagram 200 are IL and VOUT (e.g., each as present at the node 158) and VIN (e.g., as provided by the power source 108). Further illustrated in the diagram 200 are a signal VC present at the node 166, VSENSE, RAMP_BU, RAMP_BU, and a signal CC that is present at the node 160. In at least some examples, CC has a value determined according to a difference between the illustrated signals VC and VSENSE.

As illustrated in the diagram 200, when the power converter 104 is operating in a buck mode of operation and the comparator 114 determines that CC is greater in value than RAMP_BU, IL and VOUT increase in value. For example, when CC is greater in value than RAMP_BU, the power converter 104 is controlled to operate in a buck energize phase in which the transistor 132 and transistor 136 are controlled to turn on and the transistor 134 and transistor 138 are controlled to turn off. During the buck energize phase, the inductor 140 is charged or energized. When the power converter 104 is operating in the buck mode of operation and the comparator 114 determines that CC is not greater in value than RAMP_BU, IL and VOUT decrease in value. For example, when CC is not greater in value than RAMP_BU, the power converter 104 is controlled to operate in a buck de-energize phase in which the transistor 134 and transistor 136 are controlled to turn on and the transistor 132 and transistor 138 are controlled to turn off. During the buck de-energize phase, the inductor 140 is discharged or de-energized.

Figure 3:
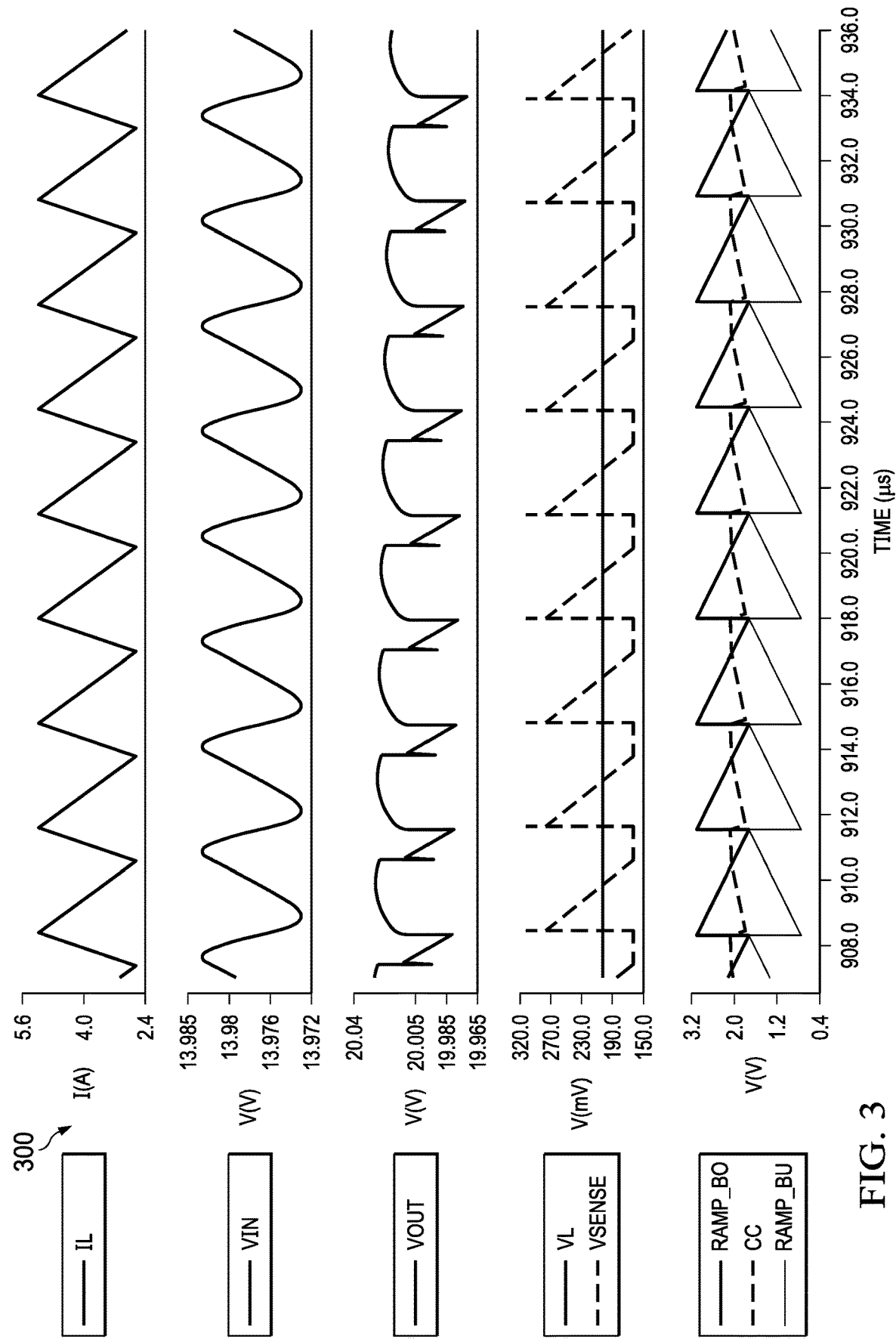
FIG. 3 shows a diagram of illustrative power converter signal waveforms in accordance with various examples.

Turning now to FIG. 3, a diagram 300 of illustrative power converter signal waveforms is shown. The diagram 300 illustrates signal waveforms present in at least some implementations of the system 100 of FIG. 1 when the power converter 104, also of FIG. 1, is operating in a boost mode of operation. Accordingly, reference is made to components of FIG. 1 in describing the diagram 300. Signals illustrated in the diagram 300 are the same, and determined in the same manner, as those of the diagram 200. Thus, a description of the signals is not repeated.

As illustrated in the diagram 300, when the power converter 104 is operating in a boost mode of operation and the comparator 114 determines that CC is greater in value than RAMP_BO, IL increases in value and VOUT decreases in value. For example, when CC is greater in value than RAMP_BO, the power converter 104 is controlled to operate in a boost energize phase in which the transistor 132 and transistor 138 are controlled to turn on and the transistor 134 and transistor 136 are controlled to turn off. During the boost energize phase, the inductor 140 is charged or energized. When the power converter 104 is operating in the boost mode of operation and the comparator 114 determines that CC is not greater in value than RAMP_BO, IL decreases in value and VOUT increases in value. For example, when CC is not greater in value than RAMP_BO, the power converter 104 is controlled to operate in a boost de-energize phase in which the transistor 132 and transistor 136 are controlled to turn on and the transistor 134 and transistor 138 are controlled to turn off. During the boost de-energize phase, the inductor 140 is discharged or de-energized.

Figure 4:
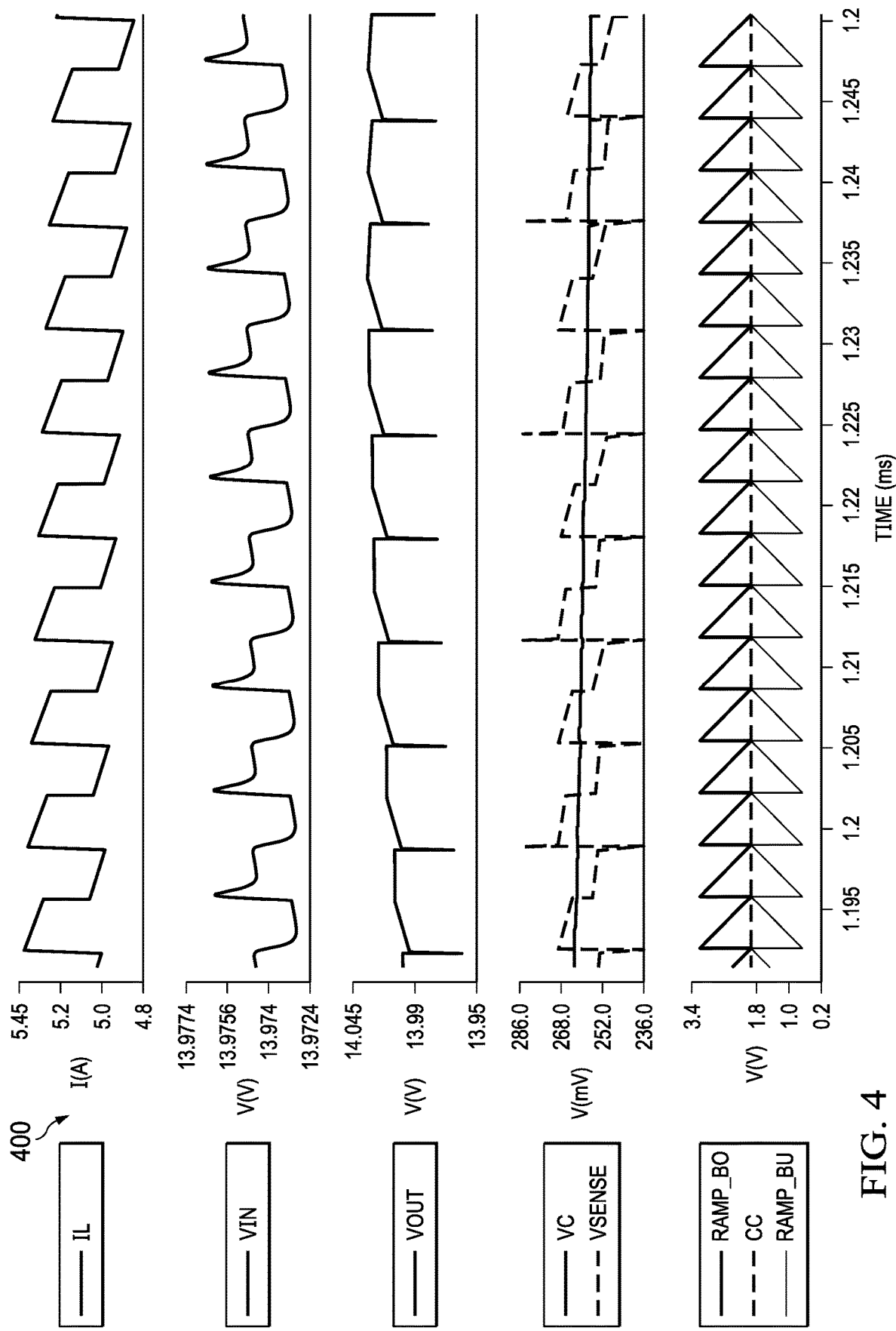
FIG. 4 shows a diagram of illustrative power converter signal waveforms in accordance with various examples.

Turning now to FIG. 4, a diagram 400 of illustrative power converter signal waveforms is shown. The diagram 400 illustrates signal waveforms present in at least some implementations of the system 100 of FIG. 1 when the power converter 104, also of FIG. 1, is operating in a buck-boost mode of operation. Accordingly, reference is made to components of FIG. 1 in describing the diagram 400. Signals illustrated in the diagram 400 are the same, and determined in the same manner, as those of the diagram 200. Thus, a description of the signals is not repeated.

As illustrated in the diagram 400, when the power converter 104 is operating in a buck-boost mode of operation, the controller 102 controls the power converter 104 to operate with interleaved buck and boost operations. For example, for a first switching cycle the controller 102 controls the power converter 104 to operate in the buck mode of operation. In a second switching cycle, the controller 102 controls the power converter 104 to operate in the boost mode of operation. Operation in the buck mode of operation and the boost mode of operation is substantially the same as described above with reference to FIG. 2 and FIG. 3, respectively. For example, control based on a comparison between RAMP_BU and CC occurs when operating according to the buck mode of operation and control based on a comparison between RAMP_BO and CC occurs when operating according to the boost mode of operation. Accordingly, the descriptions of FIG. 2 and FIG. 3 are not repeated with respect to FIG. 4.

Figure 5:
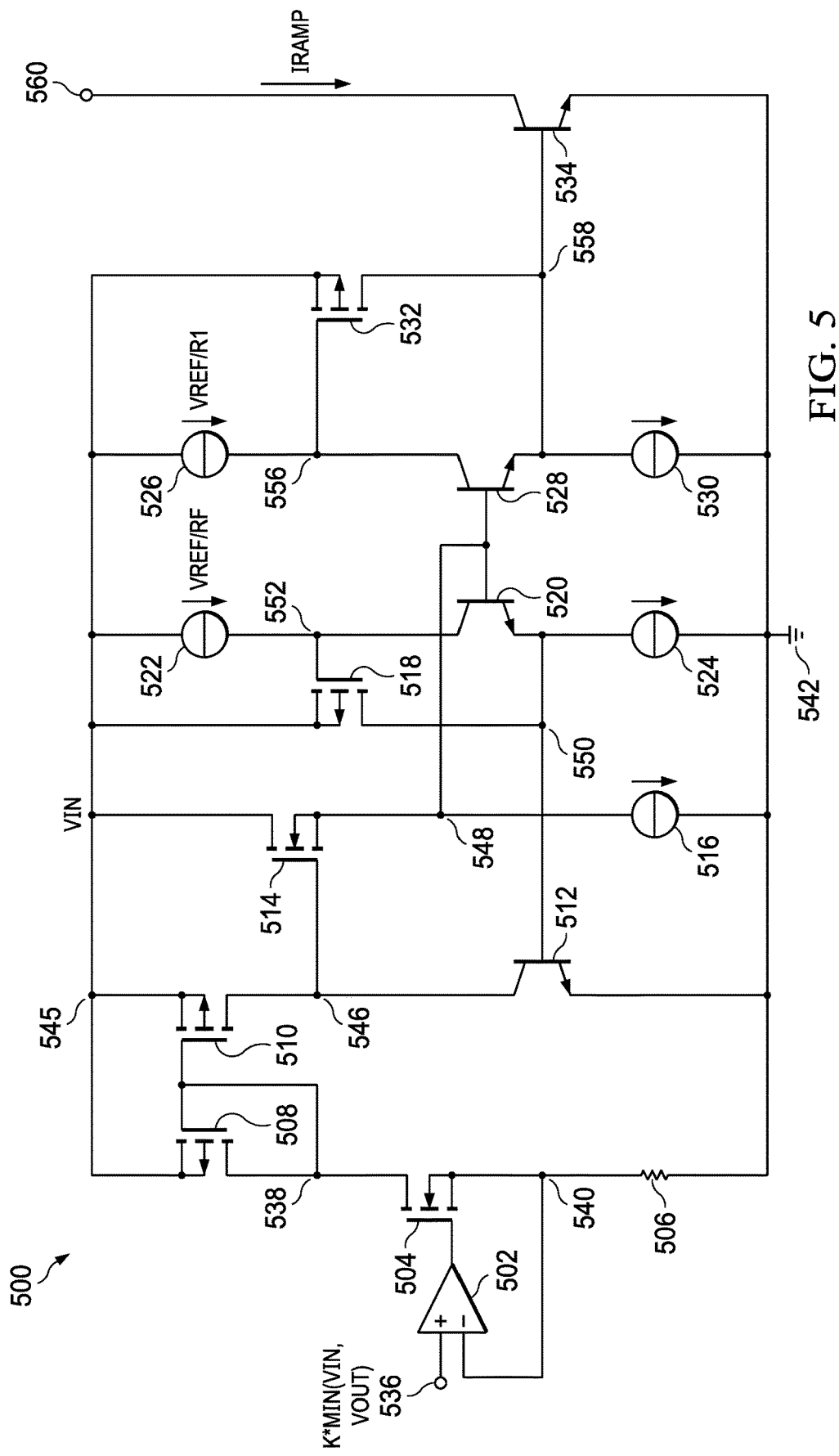
FIG. 5 shows a schematic diagram of an illustrative current signal generation circuit in accordance with various examples.

Turning now to FIG. 5, a schematic diagram of an illustrative current signal generation circuit 500 is shown. At least some examples of the circuit 500 are suitable for implementation as a component of the ramp signal generation circuit 112 of FIG. 1. Accordingly, reference may be made to components or signals of FIG. 1 in describing the circuit 500. The circuit 500, in some examples, is configured to generate IRAMP based at least partially on VIN, VOUT, and/or SW_FREQ. For example, the circuit 500 is configured to receive a signal at a node 536 that is a product of a constant K multiplied by a minimum value of VIN or VOUT. That signal is multiplied and divided by the circuit 500 with one or more additional signals, including at least IOSC, to generate RAMP. In at least some examples, K is a coefficient determined by an implementation of a system that implements the circuit 500. The signal received at the node 536 may be generated according to any suitable technique(s), the scope of which is not limited herein. In one example, a first voltage divider (not shown) generates K*VIN and a second voltage divider (not shown) generates K*VOUT. K*VIN and K*VOUT are each fed into a comparator (not shown) as respective inputs and as respective inputs of a multiplexer (not shown). The comparator determines which of K*VIN or K*VOUT is less than the other and outputs a result to the multiplexer as a select signal to select a minimum of K*VIN and K*VOUT for output by the multiplexer as the signal received at the node 536.

In at least one example, the circuit 500 includes an amplifier 502, a field-effect transistor (FET) 504, a resistor 506, a FET 508, a FET 510, a bi-polar junction transistor (BJT) 512, a FET 514, a current source 516, a FET 518, a BJT 520, a current source 522, a current source 524, a current source 526, a BJT 528, a current source 530, a FET 532, and a BJT 534. In some examples, the FET 504 and the FET 514 are n-type FETs and the FET 508, the FET 510, the FET 518, and the FET 532 are p-type FETs.

In at least one example architecture of the circuit 500, the amplifier 502 has a first input terminal (e.g., a positive or non-inverting input terminal) configured to couple to the node 536 and a second input terminal (e.g. a negative or inverting input terminal) coupled to a node 540. An output terminal of the amplifier 502 is coupled to a gate terminal of the FET 504, which has a drain terminal coupled to a node 538 and a source terminal coupled to the node 540. The resistor 506 is coupled between the node 540 and a ground node 542. The FET 508 has a drain terminal coupled to the node 538, a source terminal coupled to a node 545 that receives a supply voltage (which may be VIN or may be a supply voltage of another value), and a gate terminal coupled to the node 538. In at least some examples, the node 545 may be coupled to, or be the same node as, the node 108 of the system 100. The FET 510 has a drain terminal coupled to a node 546, a source terminal coupled to the node 545, and a gate terminal coupled to the node 538. In at least some examples, the FET 508 and the FET 510 together form a current mirror that mirrors a current from the node 538 to the node 546. The BJT 512 has a collector terminal coupled to the node 546, an emitter terminal coupled to the node 542, and a base terminal coupled to a node 550. The FET 514 has a drain terminal coupled to the node 545, a source terminal coupled to a node 548, and a gate terminal coupled to the node 546. The current source 516 is coupled between the node 548 and the ground node 542 and is configured to sink current from the node 548. The FET 518 has a drain terminal coupled to the node 550, a source terminal coupled to the node 545, and a gate terminal coupled to a node 552.

The BJT 520 has a collector terminal coupled to the node 552, an emitter terminal coupled to the node 550, and a base terminal coupled to the node 548. The current source 522 is coupled between the node 545 and the node 552 and is configured to source current to the node 552. In at least some examples, the current sourced to the node 552 is approximately equal to IOSC (which is proportional, and approximately equal, to VREF/RF). The current source 524 is coupled between the node 550 and the ground node 542 and is configured to sink current from the node 550. The current source 526 is coupled between the node 545 and a node 556 and is configured to source current to the node 556. In at least some examples, the current sourced to the node 556 is approximately equal to VREF divided by a value of the resistance of the resistor 506 (e.g., R1). The BJT 528 has a collector terminal coupled to the node 556, an emitter terminal coupled to a node 558, and a base terminal coupled to the node 548. The current source 530 is coupled between the node 558 and the ground node 542 and is configured to sink current from the node 558. The FET 532 has a drain terminal coupled to the node 558, a source terminal coupled to the node 545, and a gate terminal coupled to the node 556. The BJT 534 has a collector terminal coupled to a node 560, an emitter terminal coupled to the ground node 542, and a base terminal coupled to the node 558. In at least some examples, the node 560 is an output node of the circuit 500 at which IRAMP is present.

In an example of operation of the circuit 500, the amplifier 502 amplifies a difference between the signal received at the node 536 and a signal present at the node 540. The amplifier 502 outputs this difference as a gate control signal for controlling the FET 504. Based on this control, a current approximately equal to K*min(VIN,VOUT)/R1 (referred to hereafter in describing FIG. 5 as current I1), flows through the FET 504 and correspondingly node 538. The FET 508 and FET 510 together mirror this current from the node 538 to the node 546 to inject the current into the collector terminal of the BJT 512. IOSC is further injected into the collector terminal of the BJT 520 and VREF/R1 is injected into the collector terminal of the BJT 528 to cause IRAMP to be present at the node 560. In at least some examples, VREF/R1 is generated according to any suitable components (not shown) and mirrored to the node 556 by a current mirror functioning as the current source 526.

In some implementations, the current source 516 is a constant current bias, the current source 524 is a constant current bias that sinks VREF/RF, and the current source 530 is a constant current bias that sinks VREF/R1. In some examples, the current source 522 is a leg of a current mirror (not shown) that mirrors IOSC (which is approximately equivalent to the VREF/RF shown in FIG. 5) from the frequency circuit 146 of FIG. 1 to the node 552. Further, in some examples the current source 524 is a leg of another current mirror (not shown) that mirrors a current to the circuit 500 to sink from the node 550. In such examples, the node 550 is an input of the leg of the current source to cause IOSC to be sunk from the node 550 to the ground node 542 by the current source 524.

When current I1 is injected into the collector terminal of the BJT 512, the BJT 512 generates a base-emitter voltage (VBE1) at the node 550 approximately equal to VT*ln(I1/IS), where VT is a thermal voltage of the BJTs of the circuit 500 and IS is a saturation current of the BJTs of the circuit 500. When the current VREF/RF (referred to hereafter in describing FIG. 5 as current I2) is injected into the collector terminal of the BJT 520, the BJT 520 generates a base-emitter voltage (VBE2) equal to VT*ln(I2/IS). Accordingly, a voltage at the node 548 is approximately equal to VBE1+VBE2, which approximately equals VT*[ln(I1*I2)/IS/IS]. When the current VREF/R1 (referred to hereafter in describing FIG. 5 as current I3) is injected into the collector terminal of the BJT 528, the BJT 528 generates a base-emitter voltage (VBE3) equal to VT*ln(I3/IS). This creates a voltage at the node 558 approximately equal to VBE1+VBE2−VBE3, which approximately equals VT*ln(I1*I2/I3/IS). A base-emitter voltage of the BJT 534 is VBE4, which equals the voltage present at the node 558. A collector current of the BJT 534 is determined according to VBE4 such that the collector current of the BJT 534 approximately equals IS*exp(VBE4/VT), which equals I1*I2/I3, which equals IRAMP, as defined below. In at least some examples, the FET 514, FET 518, and FET 532 provide compensation for base currents of at least some of the BJT 512, BJT 520, BJT 528, and/or BJT 534.

While a particular architecture is shown and described for the circuit 500 and IRAMP generation, in various examples other architectures are also suitable. Generally, a circuit generating RAMP generates IRAMP according to the following equation 1.

$$IRAMP = K * \frac{\min(VIN, VOUT)}{RF} \quad (1)$$

Various circuit implementations (e.g., architectures and/or operations) may be suitable for implementing the above equation for IRAMP generation, and the present disclosure is not limited to a single particular implementation. Instead, the present disclosure is intended to encompass implementations that generate a current signal based on information from VIN, VOUT, and SW_FREQ, as discussed herein, regardless of the particular arrangement of components that generates that current signal.

As implemented by the circuit 500, RAMP is generated according to the following equation 2, where the particular arrangement of the components of the circuit 500 perform current multiplications and/or divisions to generate IRAMP.

$$IRAMP = K * \frac{\frac{\min(VIN, VOUT)}{R1} * \frac{VREF}{RF}}{\frac{VREF}{R1}} \quad (2)$$

Figure 6:
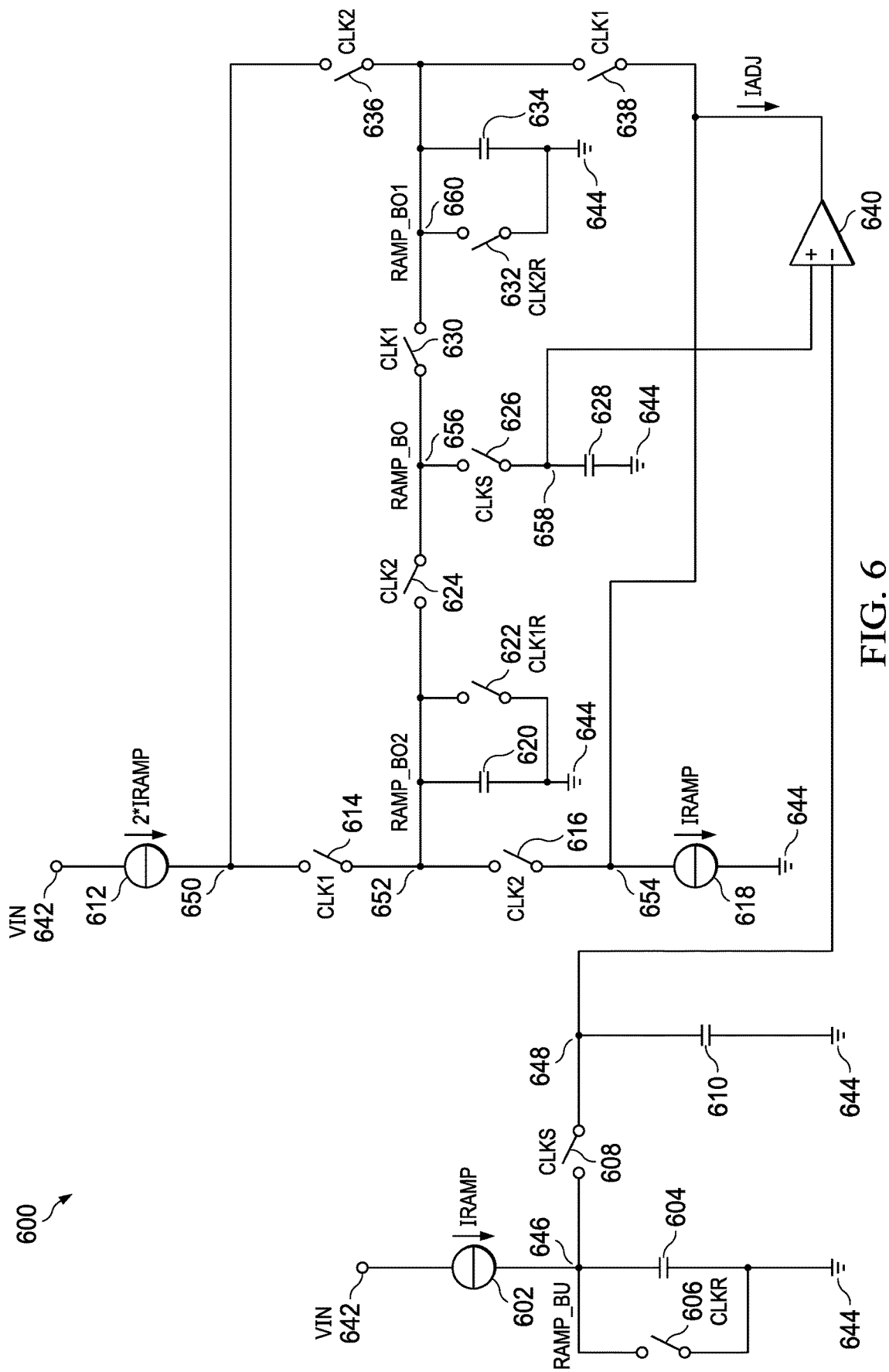
FIG. 6 shows a schematic diagram of an illustrative ramp signal generation circuit in accordance with various examples.

Turning now to FIG. 6, a schematic diagram of an illustrative ramp signal generation circuit 600 is shown. At least some examples of the circuit 600 are suitable for implementation as a component of the ramp signal generation circuit 112 of FIG. 1. For example, at least some implementations of the ramp signal generation circuit 112 include both the circuit 500 of FIG. 5 and the circuit 600. Accordingly, reference may be made to components or signals of FIG. 1 and/or FIG. 5 in describing the circuit 600. For example, at least some implementations of the circuit 600 receive one or more signals from the circuit 500 such that the circuit 500 and the circuit 600 together perform functionality ascribed to the ramp signal generation circuit 112. In such examples in which the circuit 500 and the circuit 600 together form the ramp signal generation circuit 112, the circuit 500 receives both VIN and VOUT. The circuit 600 further receives IOSC and VREF and outputs IRAMP (which is a signal internal to the circuit 112 and is not output by the ramp signal generation circuit 112). The circuit 600 receives VIN and RAMP, as well as one or more clock signals (either CLK or a plurality of clock signals derived from CLK) and outputs both RAMP_BU and RAMP_BO.

The circuit 600, in some examples, is configured to generate RAMP_BU and RAMP_BO based on RAMP and one or more clock signals. For example, the circuit 600 is configured to switch a plurality of switches according to the one or more clock signals to charge one or more capacitors, where a voltage present at the top plate of at least some of those capacitors is RAMP_BU or RAMP_BO. In at least some examples, the one or more clock signals include CLK and one or more additional clock signals derived from, or generated at least partially based on, CLK. The generation of the one or more additional clock signals is performed according to any suitable technique(s) and using any suitable components (not shown), such as digital logic gates, latches, delay circuits, etc., the scope of which is not limited herein.

As illustrated in the present disclosure, the one or more clock signals in addition to CLK include CLK1, CLK2, CLKS, CLKR, and CLK2R. CLK1, in some examples, has a frequency approximately one-half of CLK such that a width or duty cycle of CLK1 is equal to a period of CLK. CLK2 is an inversion of CLK1. Further, in some examples CLKR has an approximately same frequency as CLK and a minimum width or duty cycle sufficient for turning on the switch 622 and the switch 632 to fully discharge the capacitor 620 and the capacitor 634, respectively. In at least one example, the width is approximately 20 nanoseconds (ns). In other examples, CLKR has another width or duty cycle suitable for a particular implementation of the circuit 600 and/or a desired operation of the circuit 600. CLK1R has a frequency of about one-half of CLKR and CLK2R has a frequency of about one-half of CLKR and is phase-shifted by approximately 90 degrees. In at least some examples, CLK1R is generated as an output of a logical AND operation between CLK1 and CLKR and CLK2R is generated as an output of a logical AND operation of CLKS and CLK2R. In some examples CLKS has an approximately same frequency as CLK and a minimum width or duty cycle sufficient for turning on the switch 608 and the switch 626 to fully charge the capacitor 610 and the capacitor 628, respectively. In some examples, a falling edge of CLKS is aligned in time with a rising edge of CLK. Further, in at least one example the width is approximately 20 ns. In other examples, CLKS has another width or duty cycle suitable for a particular implementation of the circuit 600 and/or a desired operation of the circuit 600.

In at least some examples, the circuit 600 includes a current source 602, a capacitor 604, a switch 606, a switch 608, a capacitor 610, a current source 612, a switch 614, a switch 616, a current source 618, a capacitor 620, a switch 622, a switch 624, a switch 626, a capacitor 628, a switch 630, a switch 632, a capacitor 634, a switch 636, a switch 638, and an amplifier 640. In at least some examples, the current source 602 is a current mirror configured to mirror RAMP from the node 560 of the circuit 500 of FIG. 5 to the node 646. Similarly, in at least some examples the current source 612 is another current mirror configured to mirror and double RAMP from the node 560 of the circuit 500 to the node 650. Additionally, in at least some examples, the current source 618 is a current mirror configured to mirror IRAMP from the node 560 of the circuit 500, where a supply of the current mirror is the node 654. Alternatively, the current source 618 is a current mirror configured to mirror IRAMP from an intermediate node to which IRAMP is mirrored from the node 560 of the circuit 500 to cause the current source 618 to sink IRAMP from the node 654. Additionally, in at least some examples the node 642 is a supply node at which a supply voltage (which may be VIN or may be a supply voltage of another value) is present. In at least some examples, the node 642 may be coupled to, or be the same node as, the node 108 of the system 100. Additionally, each of the switches of the circuit 600 may be implemented according to any suitable technology. For example, the switches may be implemented as mechanical devices or solid-state devices (e.g., such as transistors) that may each receive and be controlled by one respective clock signal of the one or more clock signals. For example, when a clock signal is asserted, a switch receiving that clock signal may be closed or conductive between the nodes to which the switch couples. When a clock signal is de-asserted, the switch receiving that clock signal may be open or non-conductive between the nodes to which the switch couples. In at least some other examples, the behavior of the switches may be reversed (e.g., conductive when a clock signal is de-asserted and non-conductive when the clock signal is asserted).

In at least one example architecture of the circuit 600, the current source 602 is coupled between a node 642 and the node 646 and is configured to source IRAMP (e.g., a signal approximately equal in magnitude to IRAMP, as sunk by the transistor 534 of FIG. 5) to the node 646, such as through current mirroring techniques. The capacitor 604 is coupled between the node 646 and a ground node 644. The switch 606 is coupled between the node 646 and the ground node 644. The switch 608 is coupled between the node 646 and a node 648. The capacitor 610 is coupled between the node 648 and the ground node 644. The current source 612 is coupled between the node 642 and the node 650 and is configured to source 2*IRAMP to the node 650, such as through current mirroring techniques. The switch 614 is coupled between the node 650 and a node 652. The switch 616 is coupled between the node 652 and the node 654. The current source 618 is coupled between the node 654 and the ground node 644 and is configured to sink IRAMP from the node 654. The capacitor 620 and the switch 622 are each coupled between the node 652 and the ground node 644. The switch 624 is coupled between the node 652 and a node 656. The switch 626 is coupled between the node 656 and a node 658. The capacitor 628 is coupled between the node 658 and the ground node 644. The switch 630 is coupled between the node 656 and a node 660. The switch 632 and the capacitor 634 are each coupled between the node 660 and the ground node 644. The switch 636 is coupled between the node 660 and the node 650. The switch 638 is coupled between the node 660 and the node 654. The amplifier 640 has a first input terminal (e.g., a positive or non-inverting input terminal) coupled to the node 658, a second input terminal (e.g., a negative or inverting input terminal) coupled to the node 648, and an output terminal coupled to the node 654.

Figure 7:
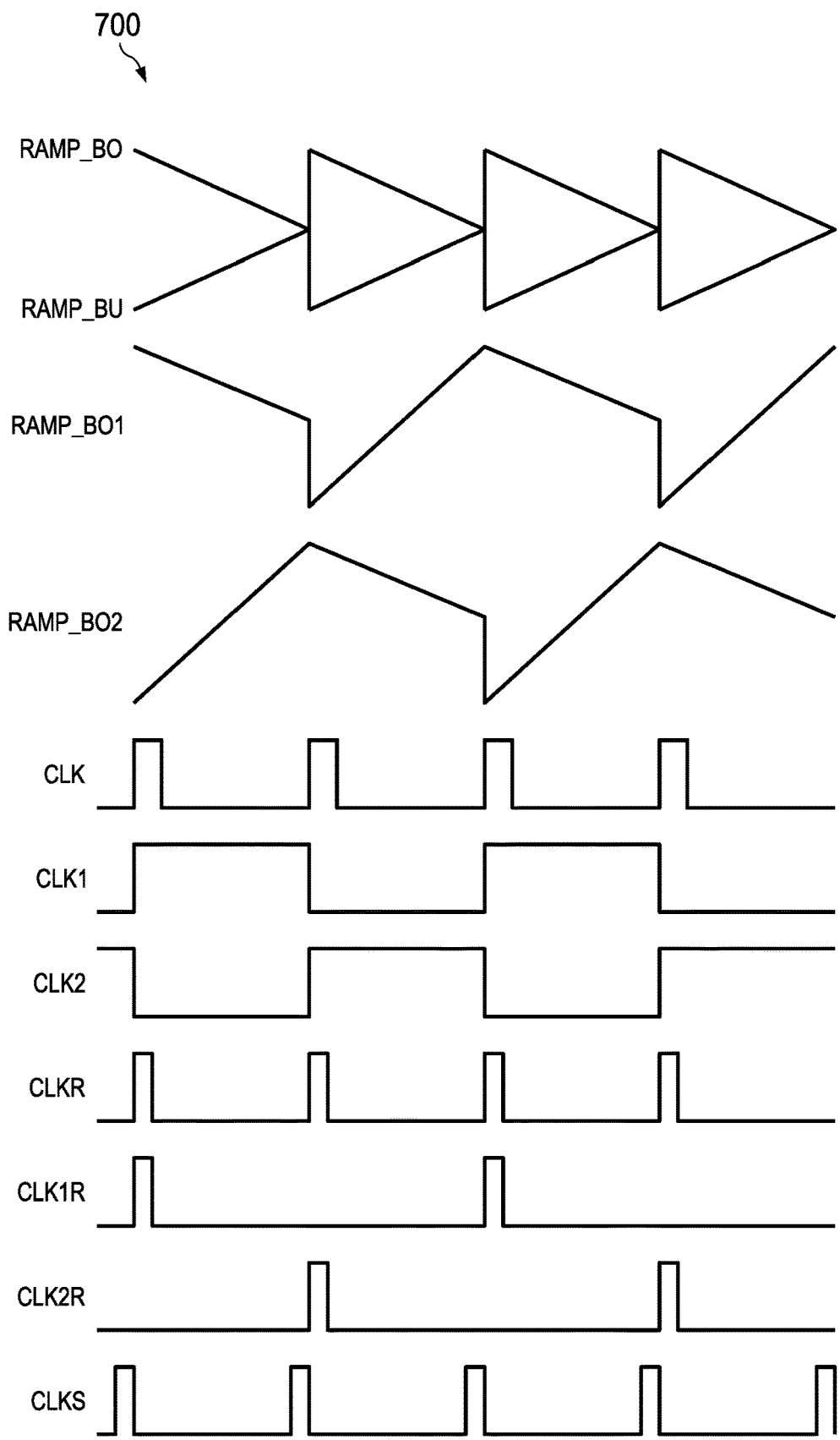
FIG. 7 shows a diagram of illustrative ramp and timing signal waveforms in accordance with various examples.

Understanding of the circuit 600 may be enhanced by simultaneous reference to FIG. 7. FIG. 7 is a diagram 700 illustrating ramp and timing signal waveforms of the circuit 600. For example, the diagram 700 illustrates RAMP_BU, RAMP_BO, RAMP_BO1 (e.g., a voltage present at the node 660), and RAMP_BO2 (e.g., a voltage present at the node 652). The diagram 700 further illustrates CLK, CLK1, which is received by, and controls operation of, the switch 614, the switch 626, and the switch 630, and CLK2, which is received by, and controls operation of, the switch 616, the switch 624, and the switch 636. The diagram 700 further illustrates CLK1R, which is received by, and controls operation of, the switch 622 and CLK2R, which is received by, and controls operation of, the switch 632. The diagram 700 further illustrates CLKR, which is received by, and controls operation of, the switch 606 and CLKS, which is received by, and controls operation of, the switch 608 and the switch 626.

In an example of operation of the circuit 600, RAMP_BU is present at the node 646. Additionally, RAMP_BO is present at the node 656, which is alternatingly switched between the node 652 and the node 660 to cause RAMP_BO to include the falling portions of RAMP_BO1 followed by the falling portion of RAMP_BO2. Based on IRAMP received at the node 646, and when CLKR is de-asserted, the capacitor 604 charges to generate a voltage at the node 646, where that voltage is RAMP_BU. When CLKR is asserted, and until CLKR is again de-asserted, the switch 606 closes to discharge the capacitor 604 to the ground node 644. Discharging the capacitor 604 resets the capacitor 604 and generates a new cycle of RAMP_BU.

When CLK1 is asserted and CLK2 is de-asserted, the capacitor 620 charges at a rate determined according to 2*IRAMP and the capacitor 634 discharges to the node 656 and the node 654 to form a first portion of RAMP_BO. For example, when CLK1 is asserted, and until CLK1 is again de-asserted, the switch 614 closes to charge the capacitor 620. Further while CLK1 is asserted, and until CLK is again de-asserted, the switch 630 and the switch 638 close to discharge the capacitor 634 to the node 656 and the node 654, respectively. In at least some examples, a rate of discharge of the capacitor 634 is determined according to RAMP, as sunk by the current source 618. When CLK1 is de-asserted and CLK2 is asserted, the capacitor 634 charges at a rate determined according to 2*IRAMP and the capacitor 620 discharges to the node 656 and the node 654 to form a second portion of RAMP_BO. For example, when CLK2 is asserted, and until CLK2 is again de-asserted, the switch 636 closes to charge the capacitor 634. Further while CLK2 is asserted, and until CLK2 is again de-asserted, the switch 624 and the switch 616 close to discharge the capacitor 620 to the node 656 and the node 654, respectively. In at least some examples, a rate of discharge of the capacitor 620 is determined according to IRAMP, as sunk by the current source 618. In at least some examples, CLK1R is asserted just prior to assertions of CLK1 to reset (e.g., discharge to ground) the capacitor 620 and CLK2R is asserted just prior to assertions of CLK2 to reset the capacitor 634. For example, when CLK1R is asserted, and until CLK1R is again de-asserted, the switch 622 closes to discharge the capacitor 620 to the ground node 644. Discharging the capacitor 620 resets the capacitor 620 and generates a new cycle of generation of RAMP_BO2. Further, when CLK2R is asserted, and until CLK2R is again de-asserted, the switch 632 closes to discharge the capacitor 634 to the ground node 644. Discharging the capacitor 634 resets the capacitor 634 and generates a new cycle of generation of RAMP_BO1.

In at least some examples, a peak value of RAMP_BU and a minimum value of RAMP_BO are sampled according to CLKS. For example, when CLKS is asserted, the capacitor 610 charges based on RAMP_BU and the capacitor 628 charges based on RAMP_BO. To sample RAMP_BU, when CLKS is asserted, and until CLKS is again de-asserted, the switch 608 closes to charge the capacitor 610 according to RAMP_BU. To sample RAMP_BO, the switch 626 closes to charge the capacitor 628 according to RAMP_BO. The amplifier 640 receives the sample of RAMP_BO from the capacitor 628 and the sample of RAMP_BU from the capacitor 610 and generates an error current signal (IADJ) based on a difference between the sample of RAMP_BO and the sample of RAMP_BU. IADJ is added to the node 654 (e.g., either sourced to or sunk from the node 654) based on the difference between the sample of RAMP_BO and the sample of RAMP_BU to maintain the peak of RAMP_BU or the valley of RAMP_BO. In at least some examples, this generation of IADJ and providing of IADJ to the node 654 aids in smooth transition between operation modes of the power converter 104 (e.g., between the buck mode of operation and the boost mode of operation). For example, if RAMP_BU and RAMP_BO have some gap between their respective maximum and minimum values, control of the power converter 104 may be affected when a value of CC is within that gap. In at least some examples, IADJ mitigates the possibility of this effect in control of the power converter 104.

In at least some examples, the circuit 600 may be said to include a first charging path, a second charging path, a third charging path, a first discharging path, and a second discharging path, each unshown in FIG. 6 but understood by reference to the components that they respectively include. The first charging path includes the capacitor 604 that generates RAMP_BU as the first capacitor 604 charges. The second charging path includes the switch 614, and the capacitor 620. The third charging path includes the switch 636 and the capacitor 634. The first discharging path includes the switch 524, the capacitor 620, and the switch 616. The second discharging path includes the switch 630, the capacitor 634, and the switch 638. The capacitor 620 charges based on a signal present at the node 650 via the first charging path and the capacitor 634 charges based on the signal present at the node 650 via the second charging path. The capacitor 620 discharges based on a current sunk through the node 654 via the first discharging path, creating RAMP_BO2 (used as RAMP_BO during one time period) at the node 656. The capacitor 634 discharges based on a current sunk through the node 654 via the second discharging path, creating RAMP_BO1 (used as RAMP_BO during another time period) at the node 656.

Figure 8:
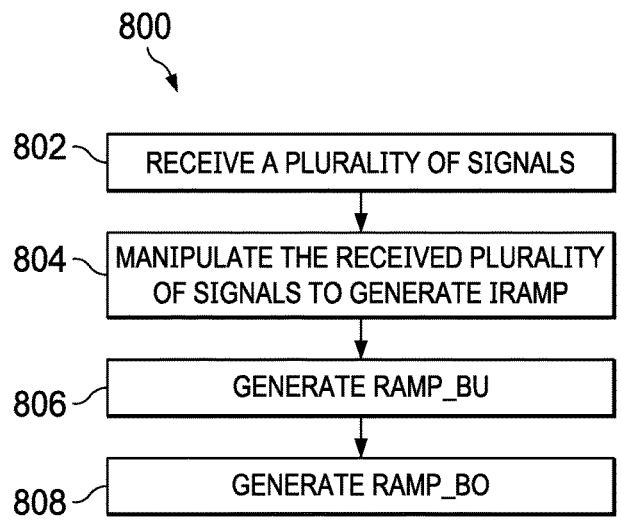
FIG. 8 shows a flowchart of an illustrative method of ramp signal generation in accordance with various examples.

Turning now to FIG. 8, an illustrative flowchart of a method 800 of ramp signal generation is shown. In at least some examples, the method 800 is implemented by a circuit such as the ramp signal generation circuit 112 of FIG. 1. Accordingly, reference may be made to components or signals of FIG. 1 in describing the method 800. The method 800 is implemented, in at least one example, to generate a ramp signal. The ramp signal may be used in controlling a power converter, as a compensation signal (e.g., slope compensation), or for any other suitable purpose for which a ramp signal is useful. In at least some examples, the ramp signal has a variable slope rate that changes with input variables. For example, rather than generating a ramp signal that has a same slope across a wide operating range (e.g., such as VIN, VOUT, and/or SW_FREQ ranges), the method 800 generates the ramp signal having a slope determined at least partially according to a current, or present, value of VIN, VOUT, and/or SW_FREQ.

At operation 802, a plurality of signals are received. The signals include at least some signals, or information pertaining to some signals, on which the ramp signal will be based. For example, in at least one implementation a minimum value of VIN or VOUT, multiplied by a constant, is received. Additionally, a current proportional to SW_FREQ is received.

At operation 804, the received plurality of signals are manipulated to generate IRAMP. In at least some examples, the plurality of signals are manipulated by a circuit comprising a plurality of transistors and current sources. For example, the plurality of signals may be manipulated by a plurality of transistors coupled in an architecture configured to perform multiplication and/or division operations that accept current signals as inputs. In other examples, the plurality of signals are manipulated by any suitable component, including a processor or other logic device that implements software to perform at least some of the manipulations. The plurality of signals are manipulated to generate IRAMP as previously defined above in equation 1.

At operation 806, RAMP_BU is generated. RAMP_BU is generated, in at least some examples, by charging a capacitor with IRAMP, where a voltage present at the top plate of the capacitor is RAMP_BU. The top plate of the capacitor may be switched to ground to enable periodic resetting of the capacitor.

At operation 808, RAMP_BO is generated. RAMP_BO is generated, in at least some examples, by charging a plurality of capacitors, where RAMP_BO is alternatingly formed of a voltage present at the top plate of the capacitors when the capacitors discharge. For example, while a first capacitor is charging, a second capacitor is discharging and a voltage present at the top plate of the second capacitor is used as RAMP_BO. Subsequently, when the second capacitor is recharging, the first capacitor is discharging and a voltage present at the top plate of the first capacitor is used as RAMP_BO. In at least some examples, this alternating pattern is implemented by alternatingly switching the top plates of the first and second capacitor to a common node at which RAMP_BO becomes present. The top plate of the first capacitor and the second capacitor may each be switched to ground to enable periodic resetting of the first capacitor and the second capacitor, respectively.

While the operations of the method 800 have been discussed and labeled with numerical reference, in various examples the method 800 includes additional operations that are not recited herein. In some examples any one or more of the operations recited herein include one or more sub-operations (e.g., such as intermediary comparisons, logical operations, output selections such as via a multiplexer, format conversions, determinations, etc.). In some examples any one or more of the operations recited herein is omitted. In some examples any one or more of the operations recited herein is performed in an order other than that presented herein (e.g., in a reverse order, substantially simultaneously, overlapping, etc.). Each of these alternatives is intended to fall within the scope of the present disclosure.

Figure 9:
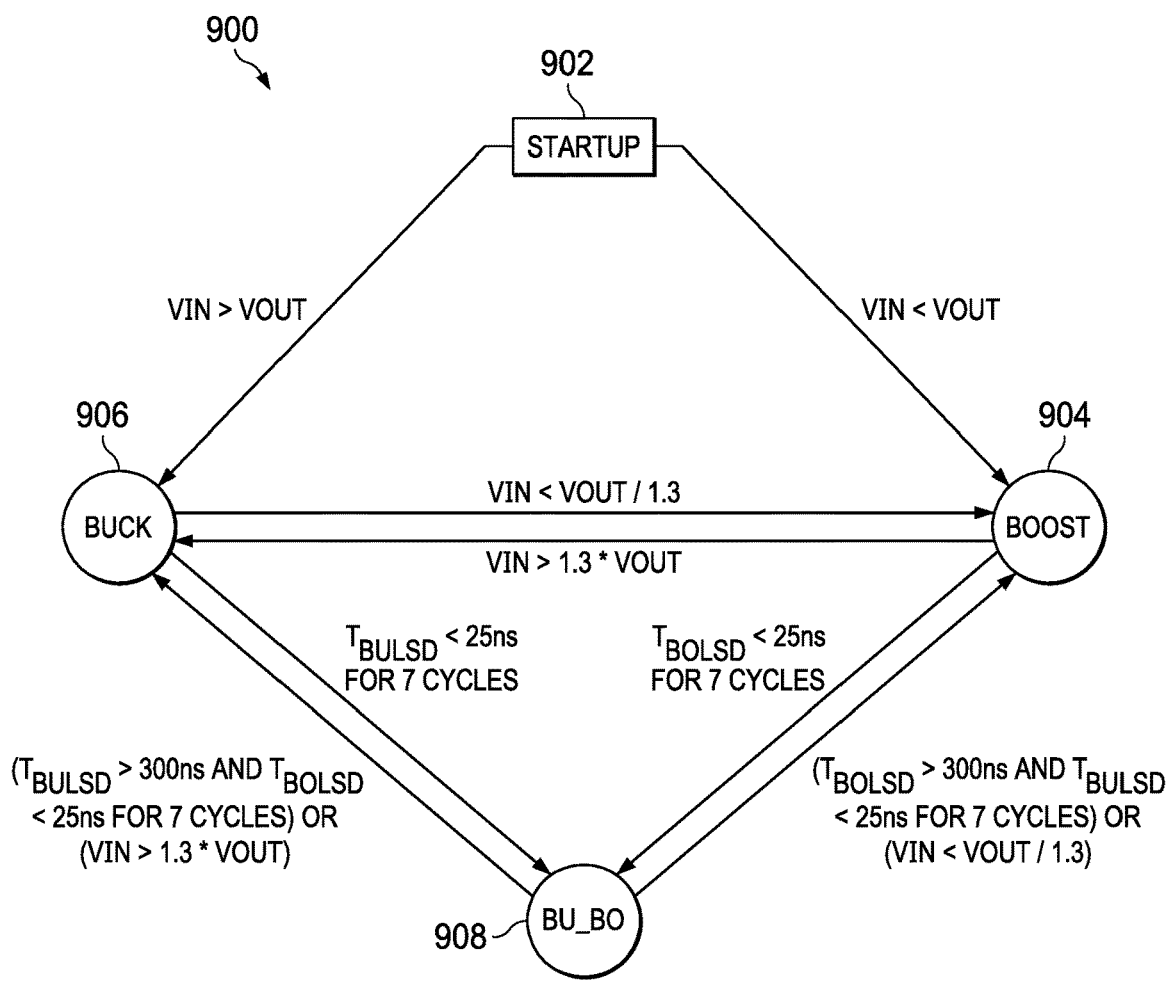
FIG. 9 shows a diagram of illustrative operation of a power delivery state machine in accordance with various examples.

Turning now to FIG. 9, an illustrative diagram 900 of operation of a power delivery state machine is shown. In at least some examples, the diagram 900 is representative of at least some actions performed by the controller 102 in controlling the power converter 104, each of FIG. 1. Accordingly, reference may be made to components or signals of FIG. 1 in describing the diagram 900.

The diagram 900 begins with state 902 which in at least some examples is startup of the system 100. At startup, a determination is made of a value of VIN with respect to a desired value of VOUT. When VIN is less than the desired value of VOUT, the state machine proceeds to state 904 at which the power converter 104 is controlled by the controller 102 to operate in a boost mode of operation. When VIN is greater than the desired value of VOUT, the state machine proceeds to state 906 at which the power converter 104 is controlled by the controller 102 to operate in a buck mode of operation.

The state machine remains in the state 904, controlling the power converter 104 to operate in the boost mode of operation, until the system 100 is powered off or a transition condition is met. For example, if VIN becomes greater than VOUT multiplied by a predefined constant (e.g., such as about 1.3), the state machine transitions from state 904 to state 906. Additionally, when a period of a gate control signal for a transistor of the power converter 104 is less than a predefined time for a predefined number of switching cycles, the state machine transitions from state 904 to state 908. For example, when a period of a gate control signal received by the transistor 138 is less than about 25 nanoseconds (ns) for about 7 switching cycles, the state machine transitions from state 904 to state 908.

The state machine remains in the state 906, controlling the power converter 104 to operate in the buck mode of operation, until the system 100 is powered off or a transition condition is met. For example, if VIN becomes less than VOUT divided by a predefined constant (e.g., such as about 1.3), the state machine transitions from state 906 to state 904. Additionally, when a period of a gate control signal for a transistor of the power converter 104 is less than a predefined time for a predefined number of switching cycles, the state machine transitions from state 906 to state 908. For example, when a period of a gate control signal received by the transistor 134 is less than about 25 ns for about 7 switching cycles, the state machine transitions from state 906 to state 908.

The state machine remains in the state 908, controlling the power converter 104 to operate in the buck-boost mode of operation, until the system 100 is powered off or a transition condition is met. For example, if a period of a gate control signal of a first transistor of the power converter 104 is greater than a predefined time for a predefined number of switching cycles and a period of another gate control signal of a second transistor of the power converter 104 is less than a predefined time for a predefined number of switching cycles, the state machine transitions from state 908 to state 904. For example, when a period of a gate control signal received by the transistor 138 is greater than about 300 ns and a period of a gate control signal received by the transistor 134 is less than about 25 ns, each for about 7 switching cycles, the state machine transitions from state 908 to state 904. Alternatively, if VIN becomes less than VOUT divided by a predefined constant (e.g., such as about 1.3), the state machine transitions from state 908 to state 904.

Additionally, when a period of a gate control signal received by the transistor 134 is greater than about 300 ns and a period of a gate control signal received by the transistor 138 is less than about 25 ns, each for about 7 switching cycles, the state machine transitions from state 908 to state 906. Alternatively, if VIN becomes greater than VOUT multiplied by a predefined constant (e.g., such as about 1.3), the state machine transitions from state 908 to state 906.

In the foregoing discussion, the terms "including" and "comprising" are used in an open-ended fashion, and thus should be interpreted to mean "including, but not limited to . . . ." The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, metal oxide semiconductor FET (MOSFET), n-type, p-type, etc.), these components may be exchanged for components of other process technologies (e.g., replace FET and/or MOSFET with BJT, replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means +/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
   a first charging path including a first capacitor coupled to a first output node;
   a second charging path including a first switch and a second capacitor;
   a third charging path including a second switch and a third capacitor;
   a first discharging path including the second capacitor, a third switch coupled between the second charging path and a second output node, and a fourth switch coupled between the second charging path and a fourth node; and
   a second discharging path including the third capacitor, a fifth switch coupled between the third charging path and the second output node, and a sixth switch coupled between the third node and the fourth node.

2. The circuit of claim 1, wherein the first capacitor is coupled between the first output node and a ground node, and the circuit further comprises a seventh switch coupled between the first output node and the ground node.

3. The circuit of claim 1, wherein the first switch is coupled between a first node and a second node, the second capacitor is coupled between the second node and the ground node, and the third switch is coupled between the second node and the second output node.

4. The circuit of claim 3, wherein the second switch is coupled between the first node and a third node, the third capacitor is coupled between the third node and the ground node, and the fourth switch is coupled between the third node and the second output node.

5. The circuit of claim 3, further comprising:
   an eighth switch coupled between the second node and the ground node; and
   a ninth switch coupled between the third node and the ground node.

6. The circuit of claim 1, further comprising:
   a tenth switch coupled between the second output node and a fifth node;
   a fourth capacitor coupled between the fifth node and the ground node;
   an eleventh switch coupled between the first output node and a sixth node;
   a fifth capacitor coupled between the sixth node and the ground node; and
   an amplifier having a first input terminal coupled to the fifth node, having a second input terminal coupled to the sixth node, and having an output terminal coupled to the fourth node.

7. The circuit of claim 1, further comprising a first current source, a second current source, and a third current source, wherein the first current source is configured to source an amount of current to the first output node to charge the first capacitor via the first charging path, the second current source is configured to source two times the first amount of current to the first node to charge the second capacitor via the second charging path and charge the third capacitor via the third charging path, and the third current source is configured to sink the first amount of current from the fourth node to facilitate discharging the second capacitor via the first discharging path and discharging the third capacitor via the second discharging path.

8. The circuit of claim 7, wherein the third current source is configured to modify an amount of current sunk from the fourth node based on an output of an amplifier generating a current signal that is based on a difference between a current present at a fifth node and a current present at a sixth node.

9. The circuit of claim 7, wherein the first discharging path is configured to discharge the second capacitor to the second output node to generate a first falling edge of a continuous ramp signal and the second discharging path is configured to discharge the third capacitor to the second output node to generate a second falling edge of the continuous ramp signal.

10. The circuit of claim 1, further comprising:
    a first transistor having a collector coupled to a seventh node, an emitter coupled to a ground node, and a base coupled to an eighth node;

a second transistor having a collector coupled to a ninth node, an emitter coupled to a tenth node, and a base coupled to an eleventh node;
a third transistor having a collector coupled to a twelfth node, an emitter coupled to a thirteenth node, and a base coupled to the eleventh node; and
a fourth transistor having a collector coupled to a fourteenth node, an emitter coupled to the ground node, and a base coupled to the thirteenth node.

11. The circuit of claim 10, further comprising:
a second amplifier having a first input terminal coupled to a fifteenth node, a second input terminal coupled to a sixteenth node, and an output terminal;
a fifth transistor having a drain coupled to a seventeenth node, a source coupled to the sixteenth node, and a gate coupled to the output terminal of the second amplifier;
a resistor coupled between the sixteenth node and the ground node;
a sixth transistor having a drain coupled to the seventeenth node, a source coupled to an eighteenth node, and a gate coupled to the seventeenth node; and
a seventh transistor having a drain coupled to the seventh node, a source coupled to the eighteenth node, and a gate coupled to the seventeenth node.

12. The circuit of claim 11, further comprising:
an eighth transistor having a drain coupled to the eighteenth node, a source coupled to the eleventh node, and a gate coupled to the seventh node;
a ninth transistor having a drain coupled to the eighth node, a source coupled to the eighteenth node, and a gate coupled to the ninth node; and
a tenth transistor having a drain coupled to the thirteenth node, a source coupled to the eighteenth node, and a gate coupled to the twelfth node.

13. The circuit of claim 12, further comprising a first current source, a seocnd current source and a third current source, wherein the first current source is configured to source an amount of current to the first output node that is approximately equal to a current flowing through the fourteenth node, the second current source is configured to source an amount of current to the first node that is approximately equal to two times the current flowing through the fourteenth node, and the third current source is configured to sink an amount of current from the fourth node approximately equal to the current flowing through the fourteenth node.

14. A circuit, comprising:
a current signal generation circuit configured to generate a current signal based on an input voltage value, an output voltage value, and a frequency of operation; and
a ramp signal generation circuit coupled to the current signal generation circuit and configured to:
generate a first ramp signal by charging a first capacitor based on the current signal, wherein a voltage of the first capacitor while charging is the first ramp signal; and
generate a second ramp signal by charging a second capacitor and a third capacitor based on a scaled version of the current signal, wherein a voltage of the second capacitor while discharging is the second ramp signal during a first period, and a voltage of the third capacitor while discharging is the second ramp signal during a second period.

15. The circuit of claim 14, wherein the ramp signal generation circuit includes:
a first charging path including a first capacitor coupled to a first output node;
a second charging path including a first switch and a second capacitor;
a third charging path including a second switch and a third capacitor;
a first discharging path including the second capacitor, a third switch coupled between the second charging path and a second output node, and a fourth switch coupled between the second charging path and a fourth node; and
a second discharging path including the third capacitor, a fifth switch coupled between the third charging path and the second output node, and a sixth switch coupled between the third node and the fourth node.

16. The circuit of claim 15, wherein the first capacitor is coupled between the first output node and a ground node, and the circuit further comprises a seventh switch coupled between the first output node and the ground node, the first switch is coupled between a first node and a second node, the second capacitor is coupled between the second node and the ground node, the third switch is coupled between the second node and the second output node, the second switch is coupled between the first node and a third node, the third capacitor is coupled between the third node and the ground node, and the fourth switch is coupled between the third node and the second output node.

17. The circuit of claim 16, further comprising:
an eighth switch coupled between the second node and the ground node;
a ninth switch coupled between the third node and the ground node;
a tenth switch coupled between the second output node and a fifth node;
a fourth capacitor coupled between the fifth node and the ground node;
an eleventh switch coupled between the first output node and a sixth node;
a fifth capacitor coupled between the sixth node and the ground node; and
an amplifier having a first input terminal coupled to the fifth node, a second input terminal coupled to the sixth node, and an output terminal coupled to the fourth node.

18. The circuit of claim 15, wherein the current signal generation circuit inlcudes:
a first transistor having a collector coupled to a seventh node, an emitter coupled to a ground node, and a base coupled to an eighth node;
a second transistor having a collector coupled to a ninth node, an emitter coupled to a tenth node, and a base coupled to an eleventh node;
a third transistor having a collector coupled to a twelfth node, an emitter coupled to a thirteenth node, and a base coupled to the eleventh node; and
a fourth transistor having a collector coupled to a fourteenth node, an emitter coupled to the ground node, and a base coupled to the thirteenth node.

19. The circuit of claim 18, wherein the current signal generation circuit further includes:
a second amplifier having a first input terminal coupled to a fifteenth node, a second input terminal coupled to a sixteenth node, and an output terminal;
a fifth transistor having a drain coupled to a seventeenth node, a source coupled to the sixteenth node, and a gate coupled to the output terminal of the second amplifier;
a resistor coupled between the sixteenth node and the ground node;

a sixth transistor having a drain coupled to the seventeenth node, a source coupled to an eighteenth node, and a gate coupled to the seventeenth node;

a seventh transistor having a drain coupled to the seventh node, a source coupled to the eighteenth node, and a gate coupled to the seventeenth node;

an eighth transistor having a drain coupled to the eighteenth node, a source coupled to the eleventh node, and a gate coupled to the seventh node;

a ninth transistor having a drain coupled to the eighth node, a source coupled to the eighteenth node, and a gate coupled to the ninth node; and a tenth transistor having a drain coupled to the thirteenth node, a source coupled to the eighteenth node, and a gate coupled to the twelfth node.

20. The circuit of claim 19, wherein the current signal is determined according to $$k * \frac{\frac{\min(VIN, VOUT)}{R1} * \frac{VREF}{RF}}{\frac{VREF}{R1}},$$

k is a constant, VIN is the input voltage value, VOUT is the output voltage value, VREF is a reference voltage, RF is a value of resistance that specifies the frequency of operation, and R1 is a value of resistance of the resistor.

21. The circuit of claim 18, wherein the fourteenth node is coupled to the ramp signal generation circuit, in which the ramp signal generation circuit is configured to receive the current signal at the fourteenth node..

22. The circuit of claim 15, wherein a current sourced to the first output node is equal in value to the current signal, a current sourced to the first node is equal in value to two times the current signal, and a current sunk from the fourth node is equal in value to the current signal.

23. The circuit of claim 14, wherein the current signal is determined according to $$k * \frac{\min(VIN, VOUT)}{RF},$$

k is a constant, VIN is the input voltage value, VOUT is the output voltage value, and RF is a value of resistance of a resistor that specifies the frequency of operation.

24. A system, comprising:
a power converter; and
a controller coupled to the power converter and including:
a current signal generation circuit configured to generate a current signal based on an input voltage value of the power converter, an output voltage value of the power converter, and a switching frequency of the power converter;
a ramp signal generation circuit configured to:
generate a first ramp signal by charging a first capacitor based on the current signal, wherein a voltage of the first capacitor while charging is the first ramp signal; and
generate a second ramp signal by charging a second capacitor and a third capacitor based on a scaled version of the current signal, wherein a voltage of the second capacitor while discharging is the second ramp signal during a first period, and wherein a voltage of the third capacitor while discharging is the second ramp signal during a second period; and
a comparator configured to:
compare the first ramp signal or the second ramp signal to an error signal determined at least partially according to an output current of the power converter; and
generate a pulse-width modulation signal, based on the comparison, to specify a duty cycle for the power converter.

25. The system of claim 24, wherein the ramp signal generation circuit includes:
a first charging path including the first capacitor coupled to a first output node;
a second charging path including a first switch and the second capacitor;
a third charging path including a second switch and the third capacitor;
a first discharging path including the second capacitor, a third switch coupled between the second charging path and a second output node, and a fourth switch coupled between the second charging path and a fourth node; and
a second discharging path including the third capacitor, a fifth switch coupled between the third charging path and the second output node, and a sixth switch coupled between the third node and the fourth node.

26. The system of claim 25, wherein a current sourced to the first output node is equal in value to the current signal, a current sourced to the first node is equal in value to two times the current signal, and a current sunk from the fourth node is equal in value to the current signal.

27. The system of claim 24, wherein the current signal generation circuit includes components configured to generate the current signal according to $$k * \frac{\min(VIN, VOUT)}{RF},$$

k is a constant, VIN is the input voltage value of the power converter, VOUT is the output voltage value of the power converter, and RF is a value of resistance of a resistor that specifies the switching frequency of the power converter.

28. The system of claim 24, wherein the current signal generation circuit includes transistors configured to perform current multiplication and current division to generate the current signal according to the input voltage value of the power converter, the output voltage value of the power converter, and a resistor that sets a switching frequency of the power converter.

29. A circuit, comprising:
a first transistor having a collector coupled to a first node, an emitter coupled to a ground node, and a base coupled to a second node;
a second transistor having a collector coupled to a third node, an emitter coupled to a fourth node, and a base coupled to a fifth node;
a third transistor having a collector coupled to a sixth node, an emitter terminal coupled to a seventh node, and a base coupled to the fifth node; and
a fourth transistor having a collector coupled to an eighth node, an emitter coupled to the ground node, and a base coupled to the seventh node.

30. The circuit of claim 29, further comprising:
an amplifier having a first input coupled to a ninth node, a second input coupled to a tenth node, and an output terminal;
a fifth transistor having a drain coupled to an eleventh node, a source coupled to the tenth node, and a gate coupled to the output terminal of the amplifier;
a resistor coupled between the tenth node and the ground node;
a sixth transistor having a drain coupled to the eleventh node, a source coupled to a twelfth node, and a gate coupled to the eleventh node; and
a seventh transistor having a drain coupled to the first node, a source coupled to the twelfth node, and a gate coupled to the eleventh node.

31. The circuit of claim 30, further comprising:
an eighth transistor having a drain coupled to the twelfth node, a source coupled to the fifth node, and a gate coupled to the first node;
a ninth transistor having a drain coupled to the second node, a source coupled to the twelfth node, and a gate coupled to the third node; and
a tenth transistor having a drain terminal coupled to the seventh node, a source coupled to the twelfth node, and a gate coupled to the sixth node.

32. The circuit of claim 31, wherein the fourth transistor is configured to sink an amount of current from the eighth node approximately equal to $$k * \frac{\frac{\min(VIN, VOUT)}{R1} * \frac{VREF}{RF}}{\frac{VREF}{R1}},$$

k is a constant, VIN is an input voltage value present at the twelfth node, VOUT is an output voltage value of a power converter, VREF is a reference voltage, RF is a value of resistance that specifies the frequency of operation of the power converter, and R1 is a value of resistance of the resistor.

33. The circuit of claim 29, further comprising a ramp signal generation circuit coupled to the eighth node and configured to:
generate a first ramp signal by charging a first capacitor based on a current signal approximately equal in magnitude to a current sunk by the fourth transistor, wherein a voltage of the first capacitor while charging is the first ramp signal; and
generate a second ramp signal by charging a second capacitor and a third capacitor based on a scaled version of the current signal, wherein a voltage of the second capacitor while discharging is the second ramp signal during a first period, and wherein a voltage of the third capacitor while discharging is the second ramp signal during a second period.

34. The circuit of claim 33, wherein the ramp signal generation circuit includes:
a first charging path including the first capacitor coupled to a first output node at which the first ramp signal is present;
a second charging path including a first switch and the second capacitor;
a third charging path including a second switch and the third capacitor;
a first discharging path including the second capacitor, a third switch coupled between the second charging path and a second output node at which the second ramp signal is present, and a fourth switch coupled between the second charging path and a fourth node; and
a second discharging path including the third capacitor, a fifth switch coupled between the third charging path and the second output node, and a sixth switch coupled between the third node and the fourth node.

* * * * *